(12) United States Patent
Nakajima et al.

(10) Patent No.: US 8,891,683 B2
(45) Date of Patent: Nov. 18, 2014

(54) IBOC BROADCAST RECEIVER

(75) Inventors: Naoki Nakajima, Tokyo (JP);
Kazuyoshi Inako, Saitama (JP);
Masanori Ishida, Ageo (JP); Kazuo Koyama, Hasuda (JP)

(73) Assignee: Clarion Co., Ltd., Tokyo (JP)

( * ) Notice: Subject to any disclaimer, the term of this patent is extended or adjusted under 35 U.S.C. 154(b) by 1206 days.

(21) Appl. No.: 12/310,578

(22) PCT Filed: Aug. 30, 2007

(86) PCT No.: PCT/JP2007/066903
§ 371 (c)(1),
(2), (4) Date: Apr. 19, 2010

(87) PCT Pub. No.: WO2008/026696
PCT Pub. Date: Mar. 6, 2008

(65) Prior Publication Data
US 2011/0128996 A1    Jun. 2, 2011

(30) Foreign Application Priority Data

Sep. 1, 2006  (JP) ................................. 2006-238106

(51) Int. Cl.
| | | |
|---|---|---|
| H03K 9/00 | (2006.01) | |
| H03J 1/00 | (2006.01) | |
| H04H 20/30 | (2008.01) | |
| H04H 60/73 | (2008.01) | |
| H04H 60/44 | (2008.01) | |

(52) U.S. Cl.
CPC .............. H03J 1/0075 (2013.01); H04H 60/73 (2013.01); H04H 60/44 (2013.01); H04H 2201/183 (2013.01); H04H 20/30 (2013.01)
USPC ........... 375/316; 375/324; 375/340; 375/344; 375/229

(58) Field of Classification Search
CPC . H04H 60/73; H04H 60/44; H04H 2201/183; H04H 20/30; H03J 1/0075
USPC .......... 375/316, 229, 340, 343, 344; 348/563, 348/731, 725, 734; 725/14, 40, 53, 57, 118, 725/131
See application file for complete search history.

(56) References Cited

U.S. PATENT DOCUMENTS 7,043,215 B2 *   5/2006   Toporski et al. ........... 455/186.1
7,623,890 B2 *  11/2009   Nagano et al. ............. 455/553.1

(Continued)

FOREIGN PATENT DOCUMENTS

| JP | 2001-230689 | 8/2001 |
|---|---|---|
| JP | 2001-230689 A | 8/2001 |

(Continued)

OTHER PUBLICATIONS

Chinese Office Action issued in Chinese Application No. 200780031907.2 on Sep. 25, 2012.
Canadian Office Action issued in Canadian Application No. 2,662,106 on Apr. 30, 2014.

(Continued)

*Primary Examiner* — Dhaval Patel
(74) *Attorney, Agent, or Firm* — McCarter & English, LLP

(57) ABSTRACT

A broadcast receiver suitable for receiving broadcast signals transferred by use of signal format of IBOC system. The broadcast receiver comprises a receiving means that holds information related to channels that can be acquired by a digital signal decoding process. If information related to a channel is to be used and is held by the information holding means, then it is used.

14 Claims, 7 Drawing Sheets

(56) References Cited

U.S. PATENT DOCUMENTS

| | | |
|---|---|---|
| 7,756,497 B2 * | 7/2010 | Skeie et al. ............... 455/185.1 |
| 7,825,988 B2 * | 11/2010 | Suwa et al. ................. 348/563 |
| 7,865,498 B2 * | 1/2011 | Rodriguez ................... 707/711 |
| 2003/0101453 A1 * | 5/2003 | Matsuyama et al. ........... 725/40 |
| 2004/0110522 A1 * | 6/2004 | Howard et al. .............. 455/512 |
| 2004/0235440 A1 | 11/2004 | Toporski et al. |
| 2005/0003772 A1 | 1/2005 | Nemoto |
| 2005/0272385 A1 | 12/2005 | Nagano et al. |

FOREIGN PATENT DOCUMENTS

| | | |
|---|---|---|
| JP | 2004-349805 | 12/2004 |
| JP | 2004349805 A | 12/2004 |
| JP | 2005-333572 | 12/2005 |
| JP | 2005-333572 A | 12/2005 |

OTHER PUBLICATIONS

Canadian Office Action issued in Canadian Application No. 2,662,106 on Apr. 30, 2013.

* cited by examiner

| PRESET CHANNEL | FREQUENCY BAND(MHz) | HD STATION DETERMINATION | SHORT NAME |
|---|---|---|---|
| 0 | - | 00 | - |
| 1 | - | 00 | - |
| 2 | - | 00 | - |
| 3 | - | 00 | - |
| 4 | - | 00 | - |
| 5 | - | 00 | - |
| 6 | - | 00 | - |

FIG. 2

| PRESET CHANNEL | FREQUENCY BAND(MHz) | HD STATION DETERMINATION | SHORT NAME |
|---|---|---|---|
| 0 | 105 | 00 | - |
| 1 | 96 | 01 | ABCD |
| 2 | 98 | 02 | - |
| 3 | 100 | 00 | - |
| 4 | 102 | 01 | EFGH |
| 5 | 104 | 02 | - |
| 6 | 106 | 01 | IJKL |

FIG. 4 even the decoding process of the digital signal is not completed if the information corresponding to the channel is held in the information holding means. Thereby, it is possible to shorten the required time for the process that requires the information corresponding to the channel.

IBOC BROADCAST RECEIVER

FIELD OF THE INVENTION

The present invention relates to a broadcast receiver and a receiving method, suitable for receiving IBOC (In Band On Channel) type radio broadcast.

BACKGROUND OF THE ART

Recently, it has become popular to process and manage the sound and video in a digital format in appliances such as acoustic appliances and video appliances. Such trends in digital encoding of sound and video in appliances such as acoustic appliances are extending to the field of radio broadcasting. For example, in the United States, a digital radio broadcast system called IBOC (In Band On Channel) is proposed and made available by iBiquity Digital Corp.

Meanwhile, conventional analog radio broadcast broadcasts via carrier (Hereinafter, "analog carrier".) that has frequency distribution inside the frequency band (Hereinafter, "channel" or "frequency channel".) assigned to individual broadcast stations. Actually, in order to avoid the interference between analog carriers of adjacent channels, only the center portion of the assigned band is used for the transmission of the analog carrier, and other portions are not used. It is noted that "digital radio broadcast" in this application means "IBOC digital radio broadcast".

IBOC is a type of a digital radio broadcast that uses frequency channel assigned to the conventional analog radio broadcast. In IBOC standard, a plurality of signal formats are defined, such as a hybrid format in which the digital radio broadcast signal is multiplexed onto the conventional analog radio broadcast signal, and an all digital format consisted of only digital signals, and it is designed to gradually transfer from conventional analog radio broadcast to all digital radio broadcast that has many functions and is high in quality. In the IBOC, digital broadcast signals are transmitted with Orthogonal Frequency Division Multiplexing (OFDM) that uses many carriers (subcarriers).

Also, in the IBOC standard, a signal format called a hybrid format is defined, which is used in the transition period from analog broadcast to all digital broadcast. In the hybrid format, it allocates the subcarriers of digital broadcast in the frequency portion that is adjacent to the center portion of the channel band which the analog carrier uses and that was not conventionally used. (Hereinafter, "sideband".) In other words, in accordance with the hybrid format of the IBOC, the band allocated as the frequency channel for the conventional analog radio broadcast is utilized effectively, and the analog radio broadcast and the digital radio broadcast are simultaneously transmitted using a same channel.

For example, Japanese Patent Provisional Publication No. JP2004-349805 A1 (Hereinafter, "the Reference Document".) discloses an IBOC broadcast receiver that is capable of receiving such IBOC digital radio broadcast. First, the IBOC broadcast receiver disclosed in the Reference Document filters the received signal to pass a broad frequency band that includes a center portion in which the analog carrier of the selected frequency channel is located and the portion (sideband) in which the adjacent subcarriers are located, and the subcarrier as well as the analog carrier is decoded. Then, if an IBOC signal (an identification information showing that it is a digital radio broadcast) is acquired as a result of the decoding, since the digital radio broadcast is transmitted in the selected frequency channel, the setting of the filtering is maintained to pass a broad range of band.

On the other hand, if an IBOC signal was not acquired, then only an analog radio broadcast is transmitted in the selected frequency channel, and no valid information is included in the sideband. In addition, not only the sideband does not include a valid information, it easily suffers from disturbances due to the adjacent band (It is the noise due to the adjacent frequency channel band. Hereinafter, it is called "adjacent disturbance".), and it becomes the cause of the lowering of the carrier to noise ratio (CN ratio) of the selected frequency channel. Therefore, in case the IBOC signal was not acquired, then the signal of the selected frequency channel is filtered to pass the bandwidth of the analog carrier. Thereby, the sideband that is unneeded and easily affected by the adjacent disturbance is cut off, and the CN ratio for the analog radio broadcast is improved.

That is, the IBOC broadcast receiver disclosed in the above Reference Document is arranged to improve the CN ratio of the analog radio broadcast so that the band to pass the filter is enabled to be switched according to the existence of the IBOC signal, and the sideband is cut off to improve the CN ratio only if it is determined that the selected channel includes only an analog radio broadcast.

In the above Reference Document, in order to set the band used in the filtering process, as described above, it performs a decoding process to the selected frequency channel, and determines whether a digital radio broadcast is carried out or not in the frequency channel based on the result of the decoding process. However, the decoding process to decode the digital radio broadcast is a process that requires time. Therefore, in such an IBOC broadcast receiver, there is a problem in requiring time to set a filtering band.

DISCLOSURE OF THE INVENTION

The object of the present invention is to provide a receiver device and a receiving method that are suitable for receiving an IBOC broadcast signal and capable of decreasing the time required for the process that use information corresponding to the channel acquired from decoding the digital signal.

In accordance with an embodiment of the invention, there is provided a broadcast receiver suitable for receiving a broadcast signal transmitted in IBOC signal format, the broadcast receiver comprising, a receiver means for receiving the broadcast signal, and an information holding means for holding information corresponding to the channel that is acquirable by means of a decoding process of a digital signal. The broadcast receiver is characterized in that, when the information corresponding to the channel is utilized, the information corresponding to the channel held in the information holding means is utilized if the information corresponding to the channel is held in the information holding means.

Optionally, a broadcast receiver according to an embodiment of the invention may be arranged to further comprise a digital signal decoding means for executing a decoding process for the digital signal included in the broadcast signal received by the receiver means, and wherein the information corresponding to the channel is acquired by means of the decoding process of the digital signal if the information corresponding to the channel is not held in said information holding means. Also, it may be arranged so that the information holding means holds information corresponding to the channel acquired by means of the decoding process of the digital signal decoding means.

In a broadcast receiver so arranged, it is able to use the information corresponding to the channel for use in the process associated with receiving the broadcast signal without decoding a digital signal each time. Thereby, the operating speed of the broadcast receiver will be improved.

Optionally, a broadcast receiver according to an embodiment of the invention may be arranged to further comprise, a wideband filtering means for performing a filter process suitable for receiving a broadcast signal including a digital signal; a narrowband filtering means for performing a filter process suitable for receiving a broadcast signal including only an analog signal; and a filter determining means for determining which of the wideband filtering means or the narrowband filtering means is to be utilized based on the information corresponding to the channel.

In a broadcast receiver so arranged, it is able to determine a filter for use in receiving without decoding a digital signal each time. Thereby, it is able to modify to the suitable receiving setting rapidly.

Also, a broadcast receiver according to an embodiment of the invention may further comprise, a digital determining means for determining whether a broadcast signal of the channel includes a digital signal or not based on the decoding process of the digital signal carried out by said digital signal decoding means. In this case, it may be operated so that said information holding means holds a determination result of said digital determining means as the information corresponding to the channel, and if the determination result of said digital determining means showed that the broadcast signal includes a digital signal, said filter determining means determines to utilize the wideband filtering means, and if the determination result of said digital determining means showed that the broadcast signal does not include a digital signal, the filter determining means determines to utilize said narrowband filtering means.

Optionally, a broadcast receiver according to an embodiment of the invention may be arranged to further comprise, a channel seek means for seeking only the channels in which broadcast signals include digital signals based on the information corresponding to the channel.

In a broadcast receiver so arranged, it is able to seek only the channel performing a digital broadcast without decoding the digital signal each time, and thereby, a channel seek without delay is enabled.

Optionally, a broadcast receiver according to an embodiment of the invention may be arranged to further comprise, a display means. In this case, the display means is able to display the information corresponding to the channel.

In a broadcast receiver so arranged, it is able to display the information corresponding to the channel rapidly without decoding the digital signal and acquiring information to be displayed each time.

Also, in the above broadcast receiver, it may be arranged so that said information corresponding to the channel includes a station name information corresponding to the channel.

Optionally, a broadcast receiver according to an embodiment of the invention may be arranged such that, said information corresponding to the channel is updated based on the determination result of said digital determination means.

In a broadcast receiver so arranged, since the held information corresponding to the channel is updated suitably, it is able to receive in an appropriate setting according changes in the receiving state.

Also, in accordance with an embodiment of the invention, there is provided a method of receiving a broadcast signal transmitted in IBOC signal format, the method comprising, a receiving step for receiving the broadcast signal; and an information holding step for holding information corresponding to a channel that is acquirable by means of a decoding process of a digital signal. In this receiving method, when the information corresponding to the channel is utilized, the information corresponding to the channel held in the information holding step is utilized if the information corresponding to the channel was held in said information holding step.

Optionally, a receiving method according to an embodiment of the invention may be arranged to further comprise a digital signal decoding step for executing a decoding process for the digital signal included in the broadcast signal received in said receiver step. In this case, the information corresponding to the channel may be acquired by performing said digital signal decoding step, if the information corresponding to the channel was not held in said information holding step. Also, the information holding step may hold information corresponding to the channel acquired by the digital signal decoding step.

Optionally, a receiving method according to an embodiment of the invention may be arranged to further comprise, a filter determining step for determining which of a wideband filtering means suitable for receiving the broadcast signal including a digital signal, or a narrowband filtering means suitable for receiving the broadcast signal including only an analog signal, is to be utilized.

Optionally, a receiving method according to an embodiment of the invention may be arranged to further comprise, a digital determining step for determining whether a broadcast signal of the channel includes a digital signal or not based on the decoding process of the digital signal carried out in the digital signal decoding step. In this case, a determination result of said digital determining step may be held as the information corresponding to the channel in said information holding step, and in the filter determining step, if the determination result in said digital determining step shows that the broadcast signal includes a digital signal, determining to utilize the wideband filtering means, and if the determination result in said digital determining step shows that the broadcast signal does not include a digital signal, determining to utilize the narrowband filtering means.

Optionally, a receiving method according to an embodiment of the invention may be arranged to further comprise a seek step for seeking only the channels in which the broadcast signals include digital signals based on the information corresponding to the channel.

Optionally, a receiving method according to an embodiment of the invention may be arranged to further comprise, a step for displaying the information corresponding to the channel. In this case, said information corresponding to the channel may include a station name information corresponding to the channel.

Optionally, a receiving method according to an embodiment of the invention may be arranged so that said information corresponding to the channel is updated based on the determination result in the digital determination step.

BRIEF DESCRIPTION OF ACCOMPANYING DRAWINGS

FIG. 2 is a schematic diagram illustrating an initial table data held in the internal memory of a microcomputer according to an embodiment of the present invention.

FIG. 4 is a schematic diagram illustrating an exemplary table data held in the internal memory of a microcomputer according to an embodiment of the present invention.

DETAILED DESCRIPTION OF PREFERRED EMBODIMENTS

In the following, the arrangement and the function of the IBOC broadcast receiver according to the embodiment of the present invention will be described with reference to the drawings.

Figure 1:
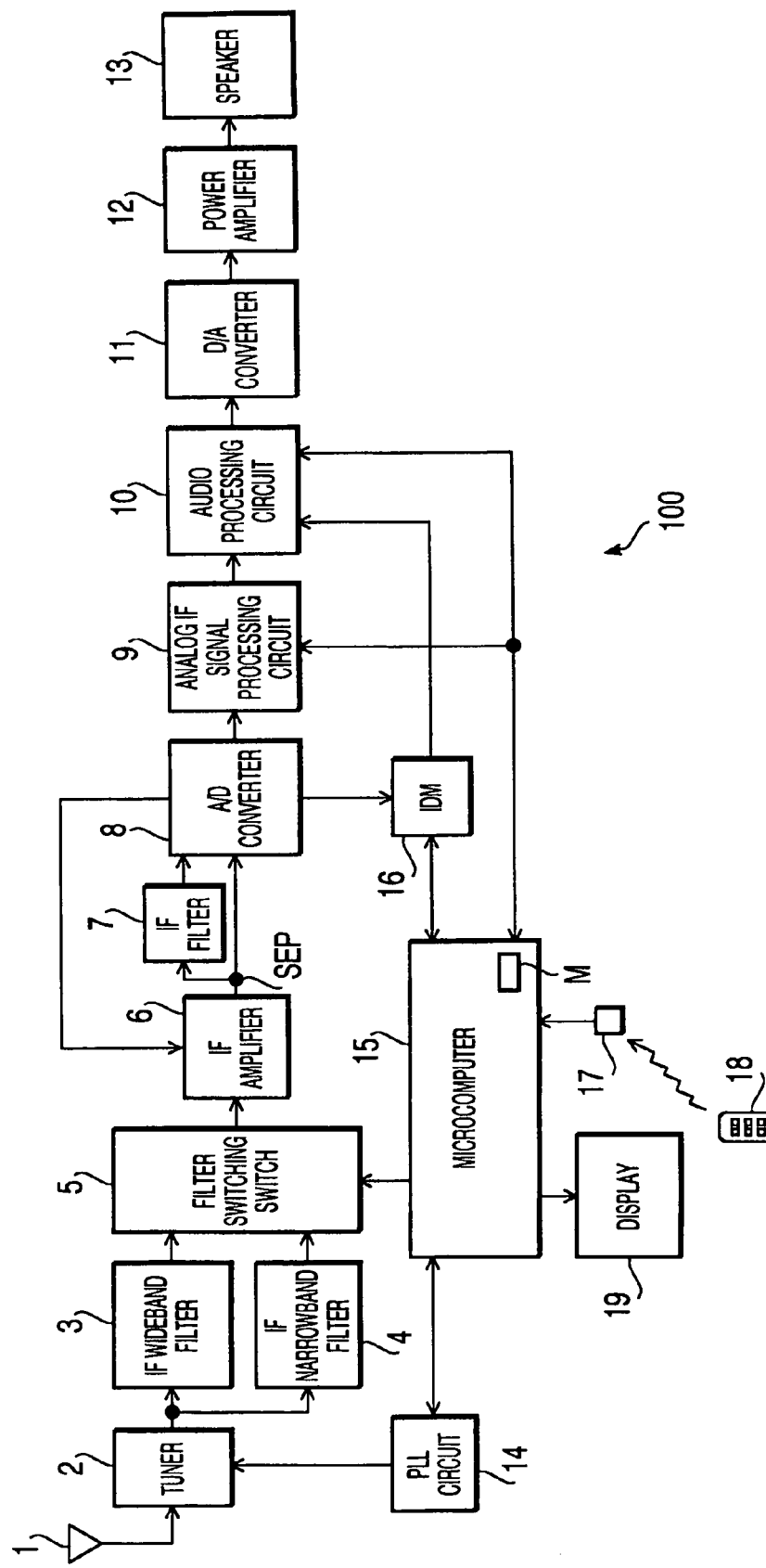
FIG. 1 is a block diagram illustrating an arrangement of the audio apparatus including an IBOC broadcast receiver according to an embodiment of the present invention.

FIG. 1 is a block diagram illustrating an arrangement of an audio apparatus 100 including an IBOC broadcast receiver according to an embodiment of the present invention. The audio apparatus 100 complies with IBOC radio broadcast, and is designed to receive and process an analog/digital radio broadcast signal of the IBOC signal format.

The audio apparatus 100 includes an antenna 1, a tuner 2, an IF (Intermediate Frequency) wideband filter 3, an IF narrowband filter 4, a filter switching switch 5, an IF amplifier 6, a separator SEP, an IF filter 7, an A/D converter 8, an analog signal processing circuit 9, an audio processing circuit 10, a D/A converter 11, a power amplifier 12, a speaker 13, a PLL (Phase Locked Loop) circuit 14, a microcomputer 15, an IDM (IBOC Digital Module) 16, an optical receiver 17, a remote controller 18, and a display 19.

The remote controller 18 is provided with operation keys for operating the audio apparatus 100. When the user operates the remote controller 18, a control pulse in accordance with the operation is output from the remote controller 18. Such control pulse output is, for example, a signal that complies with the IrDA standard. After the optical receiver 17 receives the control pulse which the remote controller 18 output, then passes it to the microcomputer 15.

The microcomputer 15 governs the general control of the overall audio apparatus 100, and the control programs are implemented on it. It executes those programs based on the control pulse received from the optical receiver 17, and controls each element within the audio apparatus 100. Also, the microcomputer includes an internal memory M. Various data is held in the internal memory M.

In the following, a series of signal processing in the audio apparatus 100 will be described.

The antenna 1 receives an RF (Radio Frequency) signal for each channel of the radio broadcast. Each RF signal received on the antenna 1 is input to the tuner 2.

The tuner 2 performs the frequency conversion by selecting the RF signal of the selected channel among input RF signals by means of the control carried out by the microcomputer 15 with the PLL circuit 14. Specifically, it converts into an intermediate frequency, i.e., IF signal, that improves the stability of the operation and the selectivity characteristics. The IF signal following the frequency conversion is input to both filters, namely, the IF wideband filter 3 and the IF narrowband filter 4. The selected channel is determined according to, for example, the selecting operation as a result of the user operation. The information regarding the last selected channel (Hereinafter, "last channel".) is, for example, held in the internal memory M of the microcomputer 15.

The IF wideband filter 3 and the IF narrowband filter 4 filter the IF signal and outputs to the filter switching switch 5. At the IF narrowband filter 4, the IF signal is filtered into an analog carrier band (Hereinafter, "narrowband".), and is output to the filter switching switch 5. At the IF wideband filter 3, the IF signal is filtered into the band which is equivalent to an analog carrier and its sideband and includes the IBOC signal (Hereinafter, the band consisting of an analog carrier and the sideband is called "wideband".), and output to the filter switching switch 5.

The filter switching switch 5 outputs an IF signal that was filtered at either one of the IF wideband filter 3 or the IF narrowband filter 4 to the IF amplifier 6. Then, the IF amplifier 6 amplifies the IF signal from the filter switching switch 5 and outputs to the separator SEP. The separator SEP separates the input IF signal to two signal components based on, for example, its frequency band. One is the signal component acquired by converting an analog carrier into the IF signal (Hereinafter, "analog IF signal".), and the other is the signal component acquired by converting the sideband into the IF signal (Hereinafter, "digital IF signal".). The separator SEP outputs each of the analog IF signal and the digital IF signal that were acquired by the separation to the IF filter 7 and the A/D converter 8, respectively.

In case the filter switching switch 5 is switch controlled in order to output the narrowband IF signal, since the sideband is cut off, the IF signal input to the IF amplifier 6 does not include a digital IF signal. In this case, the IF signal input to the separator SEP includes substantially only an analog IF signal. Therefore, even if the separation process is done at the separator SEP, the digital IF signal will not be acquired, and there will be no input from the separator SEP to the A/D converter 8.

The IF filter 7 performs filtering process to the input analog IF signal so as to remove unneeded frequency components, and outputs to the A/D converter 8. The A/D converter 8 includes A/D conversion process circuits individually for the analog IF signal and for the digital IF signal. Then, it performs an analog-to-digital conversion to the analog or digital IF signal via their respective A/D conversion process circuit. The A/D converter 8 outputs the A/D converted analog IF signal and digital IF signal to the analog signal processing circuit 9 and the IDM 16, respectively. The gain of the IF amplifier 6 is adjusted via feedback control based on the level of the IF signal input to the A/D converter 8.

The analog signal processing circuit 9 includes a detection circuit for detecting the analog IF signal, a noise canceller, and a weak electric field processing circuit. The analog IF signal input to the analog signal processing circuit 9 is decoded to the audio signal by the detection circuit. Then, the noise canceller removes the noise. After the removal of the noise, the weak electric field processing circuit performs processes that correspond to receiving status of the selected channel (e.g., mute, high cut, separation control). Then, after these series of processes, it is output to the audio processing circuit 10. For the purpose of description, the audio signal that underwent the processing of the analog signal processing circuit 9 and was output is described as an "analog audio signal".

The IDM 16 performs a well-known decoding process to the input digital IF signal and acquires an audio signal. Then, the acquired audio signal is output to the audio processing circuit 10.

Subsequently, the audio processing circuit 10 performs a predetermined process to the input audio signal and outputs to the volume circuit (not described). Such audio signal is volume controlled at the volume circuit, and then input to the D/A converter 11. It is noted that if both of the analog audio signal and the digital audio signal are input, the audio processing, circuit 10 outputs either one of them. In addition, the digital audio signal is output given priority at the initial setting. For example, when the input signal is changed from only the analog audio signal to the both audio signals, the audio processing circuit 10 operates to output the digital audio signal.

The D/A converter 11 performs a digital-to-analog conversion to the input audio signal and outputs to the power amplifier 12. The power amplifier 12 amplifies the audio signal and outputs to the speaker 13. Thereby, the radio broadcast is output and played at the speaker 13. It is noted that the audio processing circuit 10 is implemented with a blend circuit that smoothly switches between the input analog audio signal and digital audio signal and outputs. With the blend circuit, when the output signal is switched from analog audio signal to digital audio signal (or alternatively, from digital audio signal to analog audio signal), the sound output from the speaker 13 is coupled naturally so that the user does not sense the switch occurred.

In this stage, the result of the decoding performed by the IDM 16 includes data associated with the digital radio broadcast. Such data associated with the digital radio broadcast includes, for example, data representing a broadcast station which carries the digital radio broadcast (Hereinafter, "broadcast station name data".) The microcomputer 15 acquires such data from the decoding result performed by the IDM 16, and holds it in the internal memory M as a particular table data. Also, it is able to process the held data and to display it on the display 19.

FIG. 2 schematically shows the initial table data held in the internal memory M. At the audio apparatus 100, it is able to set, for example, seven preset channels from "0" to "6" by means of the user operation. In the internal memory M, the data corresponding to each preset channel is included. As shown in FIG. 2, each data includes "preset channel", "frequency band", "HD (High Definition) station determination" and "short name", which are entry data to fields relational with each other. It is noted that, initially, each of the "preset channel" has the number of the preset channel (either of "0" to "6".). Also, each of the "frequency band" and "short name" has null data ("–" in FIG. 2). Furthermore, "HD station determination" has "00". "00" is data representing that, with regards to the preset channel corresponding to the data, the below described process for determining station-existing has not been done, or the station has not been detected (i.e., station-not-existing).

Figure 3:
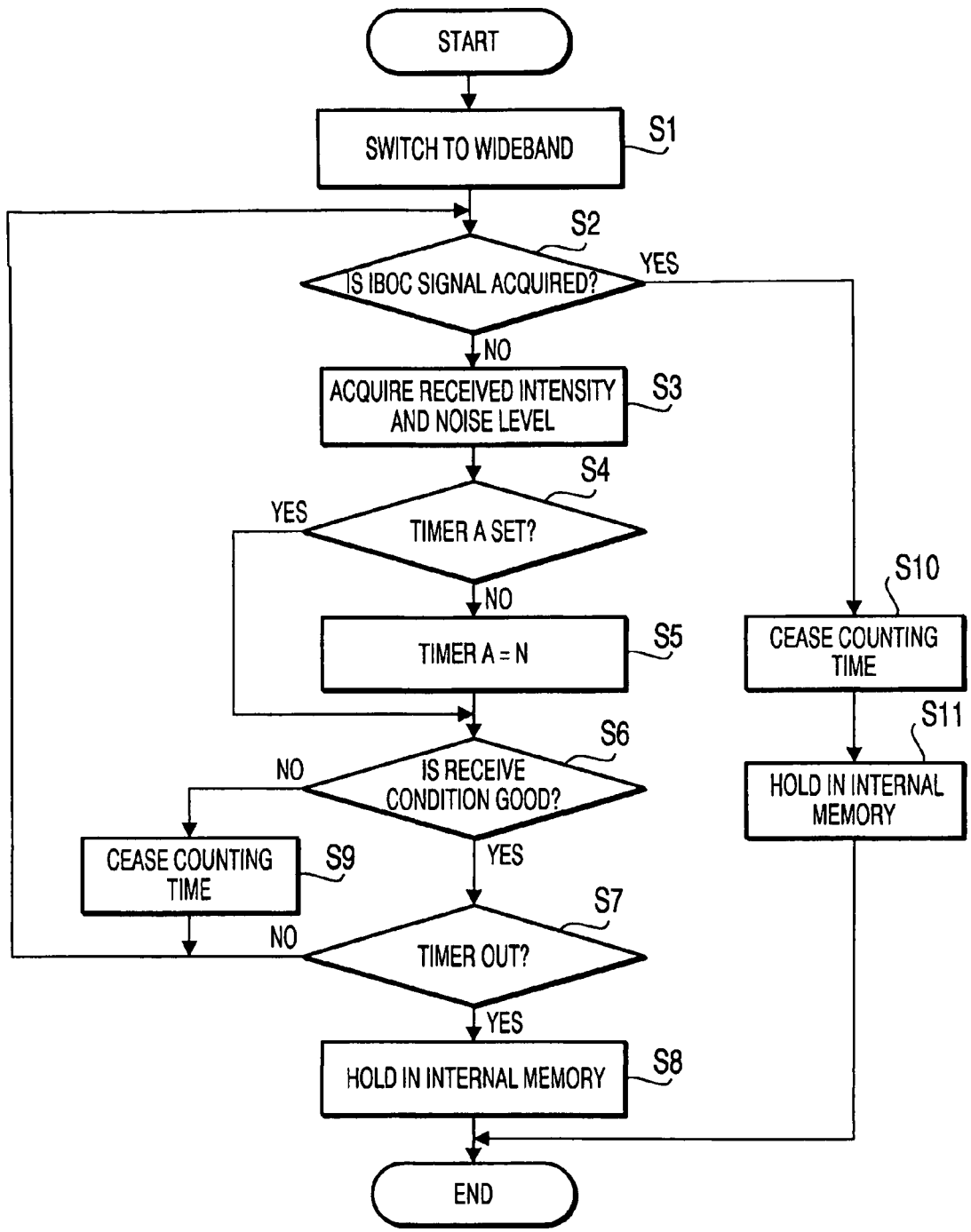
FIG. 3 is a flowchart illustrating a preset channel setting process in an audio apparatus according to an embodiment of the present invention.

The preset channel setting process in the audio apparatus 100 according to an embodiment of the present invention will now be described. FIG. 3 shows a flowchart of the preset channel setting process in the audio apparatus 100.

The flowchart process in FIG. 3 starts when a user operation is done to set the preset channel in a state when the tuner 2 is tuned to either of the frequency bands. It is noted that the user operation in this context includes, for example, holding long either of the preset channel buttons "0" to "6" in the remote controller 18 for selecting a preset channel. For example, when a preset channel button "1" is held long, the setting process for a preset channel "1" will be started.

When the process of the flowchart in FIG. 3 is started, the microcomputer 15 controls the switching of the filter switching switch 5 so that the IF wideband filter 3 and the IF amplifier 6 are connected (Step 1. In the Description and the Drawings, "step" is abbreviated as "S".). That is, the wideband IF signal is input to the IF amplifier 6. This is for enabling the processes for both the analog radio broadcast and the digital radio broadcast.

After the S I process, the microcomputer 15 tries the decoding process for the tuned frequency band carried out by the IDM 16. Then, it determines whether the IBOC signal could be acquired as a result of the decoding or not (S2). In other words, it determines whether a digital radio broadcast is performed in the tuned frequency band.

When the microcomputer 15 determines that an IBOC signal cannot be acquired in the S2 process (S2: NO), it determines that there is no digital radio broadcast performed at the tuned frequency band, and moves on to the S3 process. At the S3 process, the microcomputer 15 monitors the IF signal output by the tuner 2, acquires information for the received intensity and noise level, and then it moves on to the S4 process.

At the S4 process, the microcomputer 15 determines whether the internal timer A is set or not. In addition, this timer A is set for monitoring for a predetermined period whether the receiving status is stable or not. In case the timer A is set (S4: YES), the microcomputer 15 moves on to the S6 process. In case the timer A is not set (S4: NO), the timer A is set to "N" and starts counting time (S5), and moves on to the S6 process.

At the S6 process, the microcomputer 15 performs the process for determining the receiving condition using the receiving intensity and the noise level acquired at the S3 process. lithe receiving intensity is higher than a first threshold and lower than a second threshold (S6: YES), the microcomputer 15 determines that the receiving condition is in a level an IBOC signal can be acquired. Subsequently, it determines whether a time out has been occurred at the timer A (S7).

At the S7 process, if it is determined that a time out has been occurred at the timer A (S7: YES), the microcomputer 15 determines that it is station-existing since the receiving condition of the current frequency band is stable and in good condition. However, on the contrary, since the IBOC signal was not acquired in spite of the stable receiving condition, it is determined that there is no digital radio broadcast in the frequency band of interest and only the analog radio broadcast is performed. Then, the information for the frequency band is input to the "frequency band" associated to the currently setting preset channel, and "02" is input to "HD station determination", and the flowchart process ends. This "02" is data representing that the channel is a channel that broadcasts only an analog radio broadcast. At the S7 process, if the microcomputer 15 determined that the timer A has not been timed out (S7: NO), it goes back to the S2 process and tries to acquire the IBOC signal again.

At the S6 process, if the receiving intensity acquired at the S3 process is equal to or less than a first threshold or the noise level is equal to or more than a second threshold, the microcomputer 15 determines that the receiving condition of the current frequency band is unstable and is in a bad condition. It also determines that the receiving condition is not in a level that can acquire the IBOC signal. Then, the timer A is reset and the counting of time is ceased (S9), and it goes back to the S2 process and tries acquiring the IBOC signal again.

In another embodiment of the invention, at the S6 process, it may determine "YES" when either of the following is met:
(1) The receiving intensity acquired at the S3 process is higher than a first threshold, and
(2) The noise level acquired at the S3 process is lower than a second threshold.

At the S2 process, when it is determined that the IBOC signal is acquired (S2: YES), the microcomputer 15 resets the timer A and the time counting is ceased (S10), and determines that the current frequency band is a channel performing a digital radio broadcast. Then, the data representing the frequency band of the preset channel currently set is input to the "frequency band" corresponding to the preset channel, and "01" is input to "HD station determination". This "01" is data representing that the channel includes a digital radio broadcast. Also, it acquires the broadcast station name data from the decoding process carried out by the IDM 16, and inputs it to "short name" (S11). Then, the process of the flowchart ends.

By executing such preset channel setting processes for each of the preset channels, for example, the data shown in FIG. 4, is held in the internal memory M. In this case, when the user presses either of the preset channel buttons, "1", "4" or "6", of the remote controller 18, the associated digital radio broadcast is output and played at the speaker 13. Also, when the user presses either of the preset channel buttons, "2" or "5", of the remote controller 18, the associated digital radio broadcast is output and played at the speaker 13. Furthermore, when the user presses either of the preset channel buttons, "0" or "3", of the remote controller 18, since they are of the station-not-existing, only the noise is output to the speaker 13.

Figure 5:
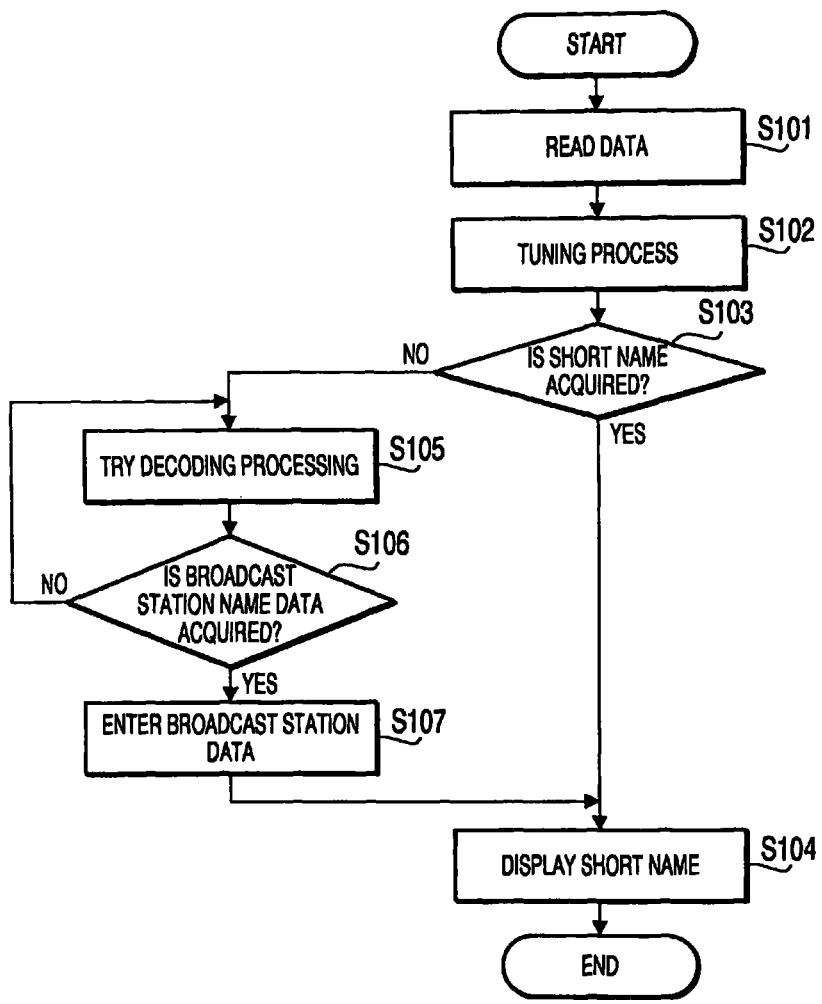
FIG. 5 is a flowchart illustrating a broadcast station displaying process in an audio apparatus according to an embodiment of the present invention.

The audio apparatus 100 according to this embodiment of the invention is able to display the broadcast station name in the display 19 using the data held in the internal memory M. FIG. 5 shows a flowchart of the broadcast station name displaying process for displaying the broadcast station name in the display 19. It is noted that, in the processes of the flowcharts in FIGS. 5-7, each of the processes is described assuming that the internal memory M is in a condition shown in FIG. 4.

The process of the flowchart in FIG. 5 starts, for example, when either of the preset channel buttons of the remote controller 18 is pressed. First, the microcomputer 15 reads the data corresponding to the pressed preset channel (Hereinafter, "selected preset channel".) from the internal memory M (Specifically, from the entry in "frequency band".) (S101). Then, the tuner 2 is controlled so that the broadcast of the selected preset channel is decoded to be output and played, and the tuning processing according to the read "frequency band" entry data is performed (S102).

Subsequent to the S102 process, the microcomputer 15 acquires the "short name" entry data of the selected preset channel from the internal memory M (S103). When the broadcast station name is acquired from the "short name" (S103: YES), the microcomputer 15 displays on the display 19 the broadcast station name of the selected preset channel based on the acquired data (104). Then, the process of this flowchart ends. Thereby, the user is able to recognize the broadcast station name visually while listening to the broadcast of the selected preset channel.

At the S103 process, when null data is acquired from the internal memory M (S103: NO), the microcomputer 15 performs a switching control to the filter switching switch 5 so that the IF wideband filter 3 and the IF amplifier 6 connect with each other. Then, the decoding process of the selected preset channel carried out by the IDM 16 is tried (S105). Thereafter, as a result of this trial, whether the broadcast station name data for the selected preset channel was acquired or not, is determined (S106).

At the S106 process, if it was not able to acquire the broadcast station name data (S106: NO), the microcomputer 15 tries the S105 process again. Alternatively, if it was able to acquire the broadcast station name data (S106: YES), such broadcast station name data is entered to the "short name" (S107). Then, it goes on to the S104 process, and the displaying processing of the broadcast station name is performed. At the S106 process, when there were more than a predetermined number of times of "NO" decisions, it is deemed that there is only an analog radio broadcast performed on the selected preset channel and that it is unable to acquire the broadcast station name data, and the process of this flowchart ends without displaying the broadcast station name.

In accordance with the audio apparatus 100 according to this embodiment of the invention, by way of arranging it to hold the broadcast station name data in advance, it becomes able to eliminate the operation of acquiring the broadcast station name data, for example, upon the selection of the channel.

At the S103 process in the flowchart shown in FIG. 5, upon acquiring the null data, the process may end without displaying the broadcast station name considering that only an analog radio broadcast is performed on the selected preset channel and it cannot acquire the broadcast station name data.

Figure 6:
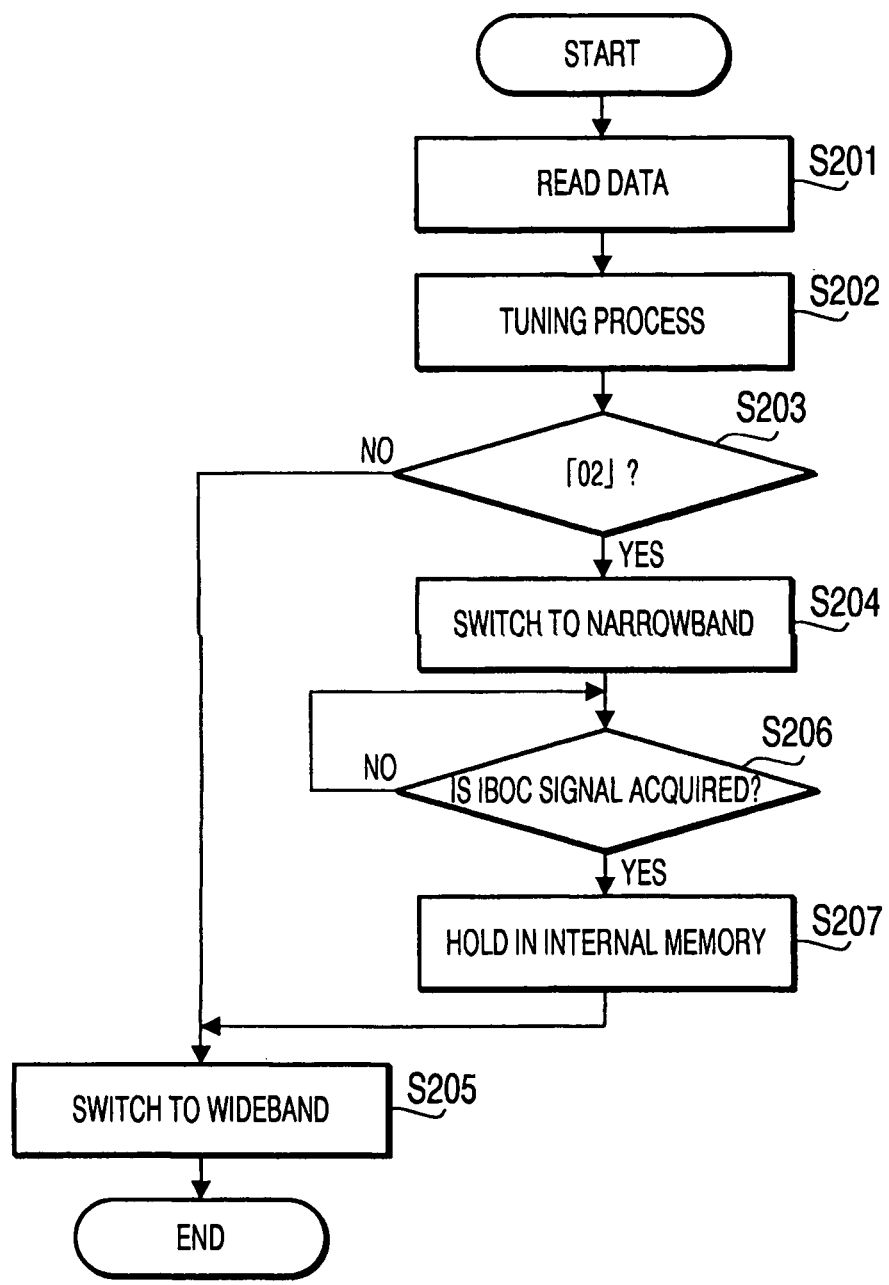
FIG. 6 is a flowchart illustrating a filter switching process in an audio apparatus according to an embodiment of the present invention.

In the following, the switching control of the filter utilizing the data held in the internal memory M is described. This process enables a band switching in a rapid operation for achieving both the improvement in CN ratio of the analog radio broadcast and the receiving of the digital radio broadcast. FIG. 6 shows a flowchart for the filter switching process according to the embodiment of the invention.

The process of the flowchart shown in FIG. 6 starts, for example, when either of the preset channel buttons of the remote controller 6 is pressed. When a preset channel button is pressed, as with the S101 process described earlier, the microcomputer 15 reads the "frequency band" data corresponding to the selected preset channel (S201). Then, the tuner 2 is controlled to decode the broadcast of the selected preset channel and to output and play, and the tuning processing corresponding to the read "frequency band" data is performed (S202).

Subsequent to the S202 process, the microcomputer 15 refers to the "HD station determination" data of the selected preset channel held in the internal memory M. Then, it is determined whether such data is "02" or not (S203).

In case it was "02" at the S203 process (S203: YES), the microcomputer 15 determines that the selected preset channel is a channel performing only an analog radio broadcast. Then, the switching control of the filter switching switch 5 is performed so that the IF narrowband filter 4 and the IF amplifier 6 are connected (S204). That is, it limits the input signal component on or after the IF amplifier 6 into a narrowband. Thereby, the sideband for the digital radio broadcast (i.e., unneeded band) is cut off and the influence of the adjacent disturbance is decreased, and the CN ratio of the analog radio broadcast is improved.

In this stage, it is able to detect a weak wideband signal, i.e., sideband signal, even if the filter switching switch 5 is switched to the IF narrowband filter 4. After the S204 switching process, the microcomputer 15 tries the decoding process for the selected preset channel carried out by the IDM 16, based on the weak sideband signal. Then, it determines whether the IBOC signal can be acquired as a result of the decoding (S206). At the S206 process, it looks for a possibility of a digital radio broadcast performed on the channel which was determined that only an analog radio broadcast was performed. This is because, due to the factors such as the noise occurred at the preset channel setting process in FIG. 3, there is a possibility of mistakes in the determination which determines that a channel performing a digital radio broadcast is a channel performing only an analog radio broadcast. If it is determined that the IBOC signal is acquired at the S206 process (S206: YES), the microcomputer 15 determines that the currently selected preset channel is a channel performing a digital radio broadcast. Then, it rewrites the "HD station determination" of the preset channel from "02" to "01". Thereafter, it goes on to the S205 process.

In case it was not "02" (i.e., "00" or "01") at the S203 process (S203: NO), the microcomputer 15 determines that the selected preset channel is a channel in which it is unclear with respect to which form of radio broadcast is performed, or is a channel performing a digital radio broadcast (More comprehensively, it is determined as a channel which has a possibility of performing a digital radio broadcast.). Then, a switching control of the filter switching switch 5 is performed so that the IF wideband filter 3 and the IF amplifier 6 are connected (S205). In other words, the input signal component on or after the IF amplifier 6 is limited to the wideband. Thereby, with regards to the selected preset channel that has "01" as the "HD station determination", the digital radio broadcast is output and played at the speaker 13. If the selected preset channel is a hybrid broadcast, depending on the setting based on the user operation, either of the analog or the digital radio broadcast is output and played at the speaker 13. With regards to the selected preset channel that has "00" as the "HD station determination", only the noise is output from the speaker 13 if it is station-not-existing. Alternatively, if it is station-existing, either of the analog or the digital radio broadcast is output and played at the speaker 13. After the S205 switching process, the microcomputer 15 ends the process of this flowchart.

In accordance with the audio apparatus 100 according to this embodiment of the invention, by means of arranging it to hold beforehand the data representing which form of the radio broadcast the selected channel is performing, the need to process the determination on the form of the radio broadcast based on, for example, the decoding result carried out by the IDM 16 during the channel selection, is eliminated. Also, it becomes able to control the switching switch 5 simultaneously with the channel selection to perform the switching to the appropriate filter, and thereby achieving fast band setting. If the "HD station determination" is "01", then, it is set to wideband so that the decoding and playing process for the digital radio broadcast is enabled. Alternatively, if the "HD station determination" is "02", then, it is set to narrowband so that the adjacent disturbance is lessen and the CN ratio of the analog radio broadcast is improved. Furthermore, if the "HD station determination" is "00", then, it is set to wideband because there is a possibility that there is a digital radio broadcast performed on that channel.

Figure 7:
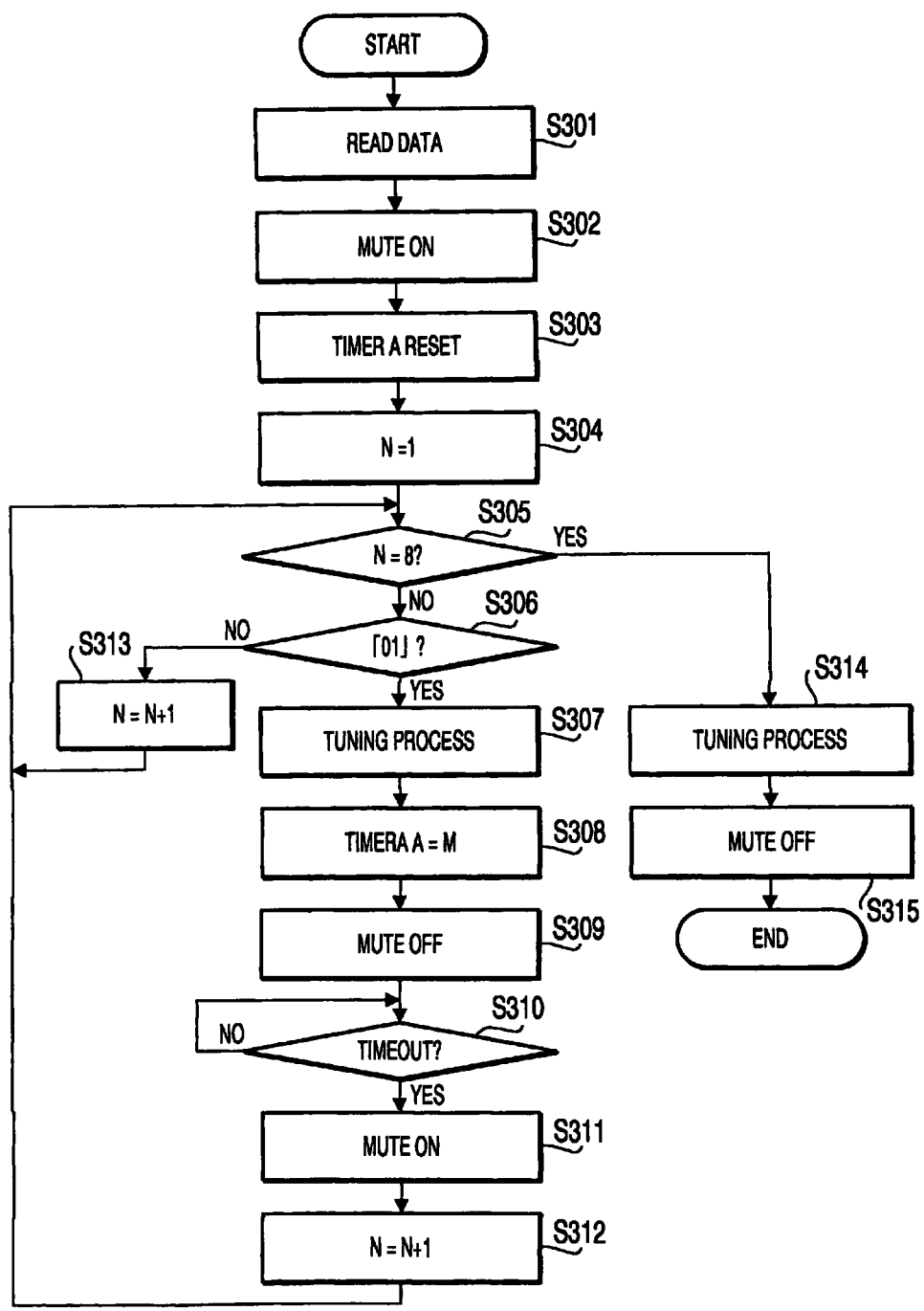
FIG. 7 is a flowchart illustrating a seek process in an audio apparatus according to an embodiment of the present invention.

In the following, a seek process utilizing the data held in the internal memory M will be described. FIG. 7 shows a flowchart of the seek process according to the embodiment of the invention. In accordance with the flowchart in FIG. 7, it will be able to execute the seek of the channel performing a digital radio broadcast in a short time.

The process of the flowchart in FIG. 7 starts, for example, when either of the preset channel buttons of the remote controller 18 had been double-clicked. In response to the above double-click, the microcomputer 15 reads the "frequency band" data corresponding to the selected preset channel (In this case, the preset channel associated with the double-clicked button.) from the internal memory M, as in the above described S101 process (S301).

Subsequent to the S301 process, the microcomputer 15 turns the mute function on so that the sound will not be output at the speaker 13 (S302). Then, the microcomputer 15 resets the timer A (S303), and sets the count value N of the internal counter to "1" (S304).

Subsequent to the S304 process, the microcomputer determines whether the count value N is "8" or not (S305). The numerical value adopting herein as a determination criterion is a number added 1 to the number of the preset channels (7 in this embodiment). At the S305 process, if it is determined that the count value N is not "8" (S305: NO), the microcomputer 15 refers to the "HD station determination" data of the selected preset channel considering that a preset channel which had not went through the processes on and after S305 exists. Then, it determines whether this data is "01" or not (S306).

If it is "01" (S306: YES), the microcomputer 15 determines that the selected preset channel is a channel performing a digital radio broadcast. Then, it controls the tuner 2 so as to be able to decode the broadcast for the selected preset channel and to output and play, and executes the tuning processing corresponding to the "frequency band" data read at the S301 process (S307). Thereafter, the timer A is set to "M" and the time counting is started (S308). Also, the mute function is turned off upon the start of the time counting (S309). Thereby, the broadcast of the selected preset channel is output and played at the speaker 13.

Subsequent to the S309 process, the microcomputer 15 monitors a time out of the timer A (S310). Then, when a time out is detected (S310: YES), the microcomputer 15 turns on the mute function again in order to cut off the sound output from the speaker 13 (S311). Thereafter, the count value N is incremented by one (S312). In conjunction with this increment, the selected preset channel is also changed to a number that is greater by one from the previous one. However, if the previous selected preset channel was "6", it changes to "0" exceptionally. After the increment process at S312, the microcomputer 15 returns to the S305 process.

If it is determined that it was not "01" at the S306 process (S306: NO), the microcomputer 15 determines that a digital radio broadcast is not performed at the selected preset channel. Then, the count value N is incremented by one as in the S312 process, and returns to the S305 process. In other words, without performing a temporary seek ceasing process at the selected preset channel (S307-S311 processes), a process for the next selected preset channel is performed.

At the S305 process, when it is determined that the count value N is "8" (S305: YES), the microcomputer 15 determines that the seek process is done for all of the preset channels. Then, the tuner 2 is controlled so that it is able to decode the broadcast for the initially selected preset channel (i.e., the preset channel corresponds to the double-clicked button) and to output and play (S314). Along with this, the mute function is turned off (S315). Thereby, the broadcast for the initial selected preset channel is output and played at the speaker 13.

Conventionally, upon performing the seek operation to a digital radio broadcast, the decoding process was done in the IDM 16 to the frequency band determined station-existing, and determined whether it was a digital radio broadcast or not based on the decoded result. In contrast, in accordance with the audio apparatus 100 of the embodiment, it is arranged so that the data representing which form of the radio broadcast the object to be sought is performing is held beforehand, and thereby, it is able to seek the digital radio broadcast without performing the decoding process at the IDM 16. Since the time lengthy decoding process carried out by the IDM 16 is avoided, it is able to reduce the time for the seek operation.

It is noted that it is able to achieve a rapid seek process against an analog radio broadcast by means of modifying the S306 process so as to determine whether the data is "02" or not.

Embodiments according to the invention is described above. However, the invention is not limited to the above embodiments and various changes can be made with the above embodiments.

What is claimed is:

1. A broadcast receiver suitable for receiving a broadcast signal transmitted in IBOC signal format, the broadcast received comprising:
    a display unit;
    a receiving unit that receives the broadcast signal; and
    an information holding unit that holds information corresponding to a channel that is acquirable by means of a decoding process of a digital signal, the information including station name information and a frequency band corresponding to the channel;
    wherein:
    if the information corresponding to the IBOC signal channel is held in the information holding unit, when the IBOC signal channel to which the information pertains is subsequently selected, the information corresponding to that IBOC signal channel is utilized to perform a tuning process according to the frequency band of the information corresponding to that IBOC signal channel to which the information pertains and the station name information of the information corresponding to that IBOC signal channel is displayed on the display unit.

2. The broadcast receiver according to claim 1, further comprising a digital signal decoding unit that executes a decoding process for the digital signal including in the broadcast signal received by the receiving unit, wherein the information corresponding to the channel is acquired by means of the decoding process of the digital signal if the information corresponding to the channel is not held in the information holding unit.

3. The broadcast receiver according to claim 1, wherein the information holding unit holds the information corresponding to the channel acquired by means of the decoding process of the digital signal decoding unit.

4. The broadcast receiver according to claim 1, further comprising: a wideband filtering unit that performs a filter process suitable for receiving a broadcast signal including a digital signal; a narrowband filtering unit that performs a filter process suitable for receiving a broadcast signal including only an analog signal; and a filter determining unit that determines which of the wideband filtering unit or the narrowband filtering unit is to be utilized based on the information corresponding the channel.

5. The broadcast receiver according to claim 4, further comprising a digital determining unit that determines whether a broadcast signal of the channel includes a digital signal or not based on the decoding process of the digital signal carried out by a digital signal decoding unit, wherein: the information holding unit holds a determination result of the digital determining unit as the information corresponding to the channel; and if the determination result of the digital determining unit shows that the broadcast signal includes a digital signal, the filter determining unit determines to utilize the wideband filtering unit, and if the determination result of the digital determining unit shows that the broadcast signal does not include a digital signal, the filter determining unit determines to utilize the narrowband filtering unit.

6. The broadcast receiver according to claim 1, wherein the receiver seeks only the channels in which broadcast signals include digital signals based on the information corresponding to the channel.

7. The broadcast receiver according to claim 1, wherein the information corresponding to the channel is updated based on a determination result of the digital determination unit.

8. A method of receiving a broadcast signal transmitted in IBOC signal format, the method comprising:
    a receiving step for receiving the broadcast signal; and
    an information holding step for holding information corresponding to an IBOC signal channel that is acquirable by means of a decoding process of a digital signal, the information corresponding to the IBOC signal channel includes station name information corresponding to the IBOC signal channel:
    characterized in that:
    the information corresponding to the IBOC signal channel held in said information holding step is processed when the IBOC signal channel to which the information pertains is subsequently selected; and
    the information corresponding to the IBOC signal channel is displayed.

9. The receiving method according to claim 8, further comprising a digital signal decoding step for executing a decoding process the digital signal included in the broadcast signal received in the receiver step, wherein the information corresponding to the channel is acquired by performing the digital signal decoding step, if the information corresponding to the channel is not held in the said information holding step.

10. The receiving method according to claim 8, wherein the information holding step holds information corresponding to the channel acquired by the digital signal decoding step.

11. The receiving method according to claim 8, further comprising a filter determining step for determining which of a wideband filtering unit suitable for receiving the broadcast signal including a digital signal, or a narrowband filtering unit suitable for receiving the broadcast signal including only an analog signal, is to be utilized.

12. The receiving method according to claim 11, further comprising a digital determining step for determining whether a broadcast signal of the channel includes a digital signal or not based on the decoding process of the digital signal carried out in the digital signal decoding step, wherein: a determination result of the digital determining step is held as the information corresponding to the channel in said information holding step; and in the filter determining step, if the determination result in the digital determining step shows that the broadcast signal includes a digital signal, it is determine to utilize the wideband filtering unit, and if the determination result in the digital determining step shows that the broadcast signal does not include a digital signal, it is determined to utilize the narrowband filtering unit.

13. The receiving method according to claim 8, further comprising a seek step for seeking only the channels in which the broadcast signals include digital signals based on the information corresponding to the channel.

14. The receiving method according to claim 8, wherein the information corresponding to the channel is updated based on a determination result in the digital determination step.

* * * * *